United States Patent [19]

Heidegger et al.

[11] Patent Number: 4,523,219

[45] Date of Patent: Jun. 11, 1985

[54] SEMICONDUCTOR COMPONENT WITH PRESSURE CONTACT

[75] Inventors: Peter Heidegger; Jakob Kiefer, both of Munich, Fed. Rep. of Germany

[73] Assignee: Siemens Aktiengesellschaft, Berlin and Munich, Fed. Rep. of Germany

[21] Appl. No.: 526,556

[22] Filed: Aug. 25, 1983

[30] Foreign Application Priority Data

Aug. 30, 1982 [DE] Fed. Rep. of Germany ....... 3232168

[51] Int. Cl.³ .................... H01L 23/42; H01L 23/44; H01L 23/46
[52] U.S. Cl. ......................................... 357/79; 357/75
[58] Field of Search .............................. 357/74, 75, 79

[56] References Cited

U.S. PATENT DOCUMENTS

| | | | |
|---|---|---|---|
| 2,946,935 | 7/1960 | Finn, Jr. | 357/79 |
| 4,100,566 | 7/1978 | Okikawa et al. | 357/79 |
| 4,224,663 | 9/1980 | Maiese et al. | 357/79 |
| 4,246,596 | 1/1981 | Iwasaki | 357/79 |
| 4,314,271 | 2/1982 | Heyke et al. | 357/79 |
| 4,381,518 | 4/1983 | Bahlinger | 357/79 |

Primary Examiner—William L. Sikes
Assistant Examiner—Robert E. Wise
Attorney, Agent, or Firm—Herbert L. Lerner; Laurence A. Greenberg

[57] ABSTRACT

Semiconductor component, including a case having a metal bottom, at least one semiconductor body disposed in the case and having first and second principal surfaces, the first principal surface being in at least thermal contact with the metal bottom, at least one lead electrode in contact with the second principal surface, a spring anchored in the metal bottom and pressing the metal bottom, semiconductor body and lead electrode together into contact with each other, casting compound at least partially filling the case and contacting given surfaces of the spring seating the spring in the casting compound, and a permanently elastic synthetic resin mass at least partially coating the given surfaces of the spring being in contact with the casting compound.

4 Claims, 1 Drawing Figure

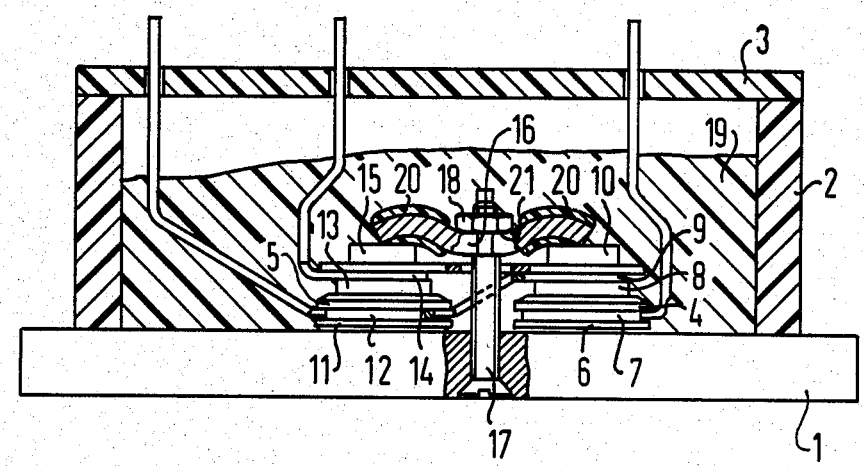

SEMICONDUCTOR COMPONENT WITH PRESSURE CONTACT

The invention relates to a semiconductor component with at least one semiconductor body which is enclosed in a case and has a principal surface in at least thermal contact with a metal bottom, at least one lead electrode in contact with another principal surface of the semiconductor body, a spring anchored in the metal body pressing parts together into contact with each other and a casting compound which at least partially fills the case.

Such a semiconductor component is described, for instance, in German Published Non-Prosecuted Application DE-OS 27 28 313, corresponding to U.S. Pat. No. 4,218,695. Measurements taken after load tests have shown that after the casting and hardening of the casting compound, an increase of the thermal resistance and instabilities of the forward characteristic appear. It has been determined that this was caused by mechanical forces which the hardened casting resin exerted on the spring. In the prior art semiconductor component, it was therefore satisfactory to only fill the case with casting resin to a point below the spring.

However, in the interest of better eliminating the environmental influences, the case should be filled with casting compound as completely as possible.

It is accordingly an object of the invention to provide a semi-conductor component with pressure contact which overcomes the hereinafore-mentioned disadvantages of the heretofore-known devices of this general type, and to do so in such a way that it is impossible for forces exerted by the casting compound to effect the spring, even if the interior of the case is filled with the casting compound up to a level above the spring.

With the foregoing and other objects in view, there is provided, in accordance with the invention, a semiconductor component including a case having a metal bottom, at least one semiconductor body disposed in the case and having first and second principal surfaces, the first principal surface being in at least thermal contact with the metal bottom, at least one lead electrode in contact with the second principal surface, a spring anchored in the metal bottom and pressing the metal bottom, semiconductor body and lead electrode together into contact with each other, casting compound at least partially filling the case and contacting given surfaces of the spring, seating the spring in the casting compound and a permanently elastic synthetic resin mass at least partially coating the given surfaces of the spring being in contact with the casting compound.

In accordance with another feature of the invention, the spring is a leaf spring and includes a surface being free of the permanently elastic synthetic resin mass for placement of a tightening tool thereon.

In accordance with a concomitant feature of the invention, the synthetic resin mass is formed of silicone rubber.

Other features which are considered as characteristic for the invention are set forth in the appended claims.

Although the invention is illustrated and described herein as embodied in semiconductor component with pressure contact, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of the specific embodiments when read in connection with the single FIGURE of the drawing which is diagrammatic, partially cross-sectional side view of the semiconductor component of the invention with the case cut apart.

Referring now in detail to the figure of the drawing, it is seen that the semiconductor component has a case which is formed of a metal bottom 1, a frame 2 and a cover 3. The case includes two semiconductor bodies 4 and 5 which are in thermal contact with the metal bottom 1. The semiconductor bodies can be electrically insulated from the metal bottom 1, but need not be insulated.

In order to provide possible electrical insulation, the bodies 4 and 5 are mounted on substrate plates or wafers 6, 11 which may be formed of beryllium oxide. In the embodiment example shown, two stacks are disposed on the metal bottom 1 and contain the following parts from the bottom up: one of the substrate wafers 6, 11, respectively; a lead 7, 12, respectively; the semiconductor body 4, 5, respectively, a contact electrode 8, 13, respectively; a lead 9, 14, respectively, and a pressure piece 10, 15, respectively. The pressure pieces 10, 15 are loaded by a spring 16 which is anchored to the metal bottom 1 by a screw 17 and a nut 18. The housing is filled with a casting compound 19 up to a level above the spring 16. The spring 16 is coated with a permanently elastic synthetic resin mass 20 which covers at least part of the surfaces of the spring which are in contact with the casting compound 19. It is important that the surfaces of the spring 16 which are in contact with the pressure pieces 10, 15 and with the nut 18, are not coated, since otherwise an exact adjustment of the spring force is not assured. The surface of the spring 16 opposite the nut 18 can likewise remain free of the coating, since in this region the forces exerted by the casting compound 19 have no substantial influence on the spring force. A leaf spring or a cup spring, for instance, can be used for the spring.

The spring pressure is adjusted by a tightening tool which is placed on a preferably flat surface 21 of the leaf spring which is perpendicular to the plane of the drawing and is ahead of and behind the nut. This surface 21 also remains free of the coating.

Silicone rubber is considered to be preferable as the permanently elastic synthetic resin mass. This can be accomplished, for instance, with a thickness of a few hundred $\mu m$, by simple immersion in silicone rubber which is not yet polymerized.

The invention has been explained with the aid of an embodiment example having two semiconductor bodies. However, it is also possible, for instance, to apply the contact pressure for a single semiconductor body with a leaf spring which rests at the center on a semiconductor body or a pressure piece. Such a leaf spring can then be held by two screws which pass through the ends of the leaf spring. It is also conceivable to contact more than two semiconductor bodies, such as by using cup spring having a rim which is coated all around with a permanently elastic synthetic resin mass.

The foregoing is a description corresponding, in substance, to German application P 32 32 168.6, dated Aug. 30, 1982, international priority of which is being claimed for the instant application, and which is hereby made part of this application. Any material discrepancies between the foregoing specification and the specification of the aforementioned corresponding German application are to be resolved in favor of the latter.

There is claimed:

1. Semiconductor component, comprising a case having a metal bottom, at least one semiconductor body disposed in said case and having first and second principal surfaces, said first principal surface being in at least thermal contact with said metal bottom, at least one lead electrode in contact with said second principal surface, a spring anchored in said metal bottom and pressing said metal bottom, semiconductor body and lead electrode together into contact with each other, casting compound at least partially filling said case and contacting given surfaces of said spring seating said spring in said casting compound, and a permanently elastic synthetic resin mass at least partially coating said given surfaces of said spring being in contact with said casting compound.

2. Semiconductor component according to claim 1, wherein said spring is a leaf spring and includes a surface being free of said permanently elastic synthetic resin mass for placement of a tightening tool thereon.

3. Semiconductor component according to claim 2, wherein said synthetic resin mass is formed of silicone rubber.

4. Semiconductor component according to claim 1, wherein said synthetic resin mass is formed of silicone rubber.

* * * * *